(12) United States Patent
Otsubo et al.

(10) Patent No.: US 10,660,219 B2
(45) Date of Patent: May 19, 2020

(54) RESIN MULTILAYER SUBSTRATE

(71) Applicant: Murata Manufacturing Co., Ltd., Nagaokakyo-shi, Kyoto-fu (JP)

(72) Inventors: Yoshihito Otsubo, Nagaokakyo (JP); Asato Fujimoto, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 16/270,659

(22) Filed: Feb. 8, 2019

(65) Prior Publication Data
US 2019/0174639 A1 Jun. 6, 2019

Related U.S. Application Data

(63) Continuation of application No. PCT/JP2017/016919, filed on Apr. 28, 2017.

(30) Foreign Application Priority Data

Aug. 23, 2016 (JP) .................................. 2016-162632

(51) Int. Cl.
*H05K 1/18* (2006.01)
*H05K 1/11* (2006.01)
(Continued)

(52) U.S. Cl.
CPC ........... *H05K 3/4644* (2013.01); *H05K 1/032* (2013.01); *H05K 1/115* (2013.01); *H05K 1/186* (2013.01);
(Continued)

(58) Field of Classification Search
CPC .... H05K 3/4644; H05K 3/4697; H05K 1/186; H05K 1/115; H05K 1/032;
(Continued)

(56) References Cited

U.S. PATENT DOCUMENTS 6,687,985 B2 * 2/2004 Sakamoto ............... H01L 23/13
174/250
2008/0049406 A1 * 2/2008 Ikezawa .............. H01L 23/5389
361/761
(Continued)

FOREIGN PATENT DOCUMENTS

JP  2013-123031 A  6/2013
JP  2014-225604 A  12/2014
(Continued)

OTHER PUBLICATIONS

Official Communication issued in International Patent Application No. PCT/JP2017/016919, dated Aug. 8, 2017.

*Primary Examiner* — Ishwarbhai B Patel
(74) *Attorney, Agent, or Firm* — Keating & Bennett, LLP

(57) ABSTRACT

A resin multilayer substrate includes a stacked body including resin layers, a component, one or more first conductor patterns, and one or more second conductor patterns each disposed in a gap between the resin layers. At least a portion of an outline of each of the one or more first conductor patterns overlaps with the component. An outline of each of the one or more second conductor patterns does not overlap with the component. A resin portion is adjacent to each of the one or more first conductor patterns along a portion of the outline of each of the one or more first conductor patterns that overlaps with the component. The resin portion is made of a resin paste including thermoplastic resin powder as a main material. The resin portion is not disposed in a portion along the outline of each of the one or more second conductor patterns.

3 Claims, 11 Drawing Sheets

(51) Int. Cl.
*H05K 3/46* (2006.01)
*H05K 1/03* (2006.01)
*H05K 1/02* (2006.01)

(52) U.S. Cl.
CPC ......... *H05K 3/4664* (2013.01); *H05K 3/4697* (2013.01); *H05K 1/0284* (2013.01); *H05K 1/0298* (2013.01); *H05K 1/11* (2013.01); *H05K 1/18* (2013.01); *H05K 2201/0129* (2013.01); *H05K 2201/0141* (2013.01); *H05K 2201/09827* (2013.01); *H05K 2203/1105* (2013.01)

(58) Field of Classification Search
CPC . H05K 2201/09827; H05K 2201/0141; H05K 2201/0129; H05K 3/4664; H05K 2203/1105
See application file for complete search history.

(56) References Cited

U.S. PATENT DOCUMENTS

| | | | |
|---|---|---|---|
| 2010/0288540 A1* | 11/2010 | Honjo | H05K 1/183 174/255 |
| 2013/0114212 A1 | 5/2013 | Tada et al. | |
| 2014/0264737 A1 | 9/2014 | Gouchi | |
| 2015/0103499 A1* | 4/2015 | Gouchi | H05K 1/186 361/746 |
| 2015/0294754 A1 | 10/2015 | Ohata | |
| 2015/0305150 A1 | 10/2015 | Ohata | |

FOREIGN PATENT DOCUMENTS

| | | |
|---|---|---|
| WO | 2014/103530 A1 | 7/2014 |
| WO | 2014/109139 A1 | 7/2014 |
| WO | 2014/188830 A1 | 11/2014 |

* cited by examiner

RESIN MULTILAYER SUBSTRATE

CROSS REFERENCE TO RELATED APPLICATIONS

This application claims the benefit of priority to Japanese Patent Application No. 2016-162632 filed on Aug. 23, 2016 and is a Continuation Application of PCT Application No. PCT/JP2017/016919 filed on Apr. 28, 2017. The entire contents of each application are hereby incorporated herein by reference.

BACKGROUND OF THE INVENTION

1. Field of the Invention

The present invention relates to a resin multilayer substrate.

2. Description of the Related Art

Japanese Patent Laid-Open No. 2014-225604 discloses an example in which a plurality of resin layers are stacked to form a stacked body, which is then thermocompression-bonded to thereby fabricate a resin multilayer substrate.

As disclosed in Japanese Patent Laid-Open No. 2014-225604, the stacked body is provided in advance with a cavity, within which a component is disposed, which is then thermocompression-bonded. Thereby, a resin multilayer substrate having a component embedded therein is able to be manufactured.

For example, in a resin multilayer substrate formed as a stacked body having a component embedded therein and having a conductor pattern provided directly below this embedded component, resin layers may be insufficiently joined to each other in a portion adjacent to the conductor pattern even after the end of the thermocompression bonding step. The reason why such a situation occurs is considered as follows. Specifically, since this insufficiently joined portion is hidden directly below the embedded component, heat and pressure by pressing in a thermocompression bonding step is not sufficiently transferred to this insufficiently joined portion as compared with the portion that is not hidden directly below the embedded component.

Furthermore, a similar problem may occur not only in the above-described portion directly below the component but also in a portion directly below a cavity provided in the stacked body so as to be recessed in the stacking direction. In addition, similar problems may also occur in some cases.

SUMMARY OF THE INVENTION

Preferred embodiments of the present invention provide resin multilayer substrates, for each of which the non-joined state between resin layers is reduced or prevented in a portion that tends to be subjected to an insufficient action of heat and pressure by pressing in a thermocompression bonding step.

A resin multilayer substrate according to a preferred embodiment of the present invention includes a stacked body including a plurality of resin layers each made of a thermoplastic resin as a main material that are stacked; a component embedded in the stacked body; one or more first conductor patterns each disposed in a gap between the resin layers inside the stacked body, the one or more first conductor patterns each having an outline in a view seen in one direction of a stacking direction of the stacked body; and one or more second conductor patterns each disposed in a gap between the resin layers inside the stacked body, the one or more second conductor patterns each having an outline in a view seen in one direction of the stacking direction of the stacked body. At least a portion of the outline of each of the one or more first conductor patterns overlaps with the component in the view seen in the one direction of the stacking direction of the stacked body. The outline of each of the one or more second conductor patterns does not overlap with the component in the view seen in the one direction of the stacking direction of the stacked body. A resin portion is adjacent to an outside of each of the one or more first conductor patterns along a portion of the outline of each of the one or more first conductor patterns, the portion overlapping with the component. The resin portion is made of a resin paste including thermoplastic resin powder as a main material. A liquid component of the resin paste does not substantially remain in the resin portion. The resin portion is not disposed in a portion along the outline of each of the one or more second conductor patterns.

According to preferred embodiments of the present invention, it is possible to provide resin multilayer substrates, for each of which the non-joined state between resin layers in a portion that tends to be subjected to an insufficient action of pressure by pressing in a thermocompression bonding step is reduced or prevented because a resin portion is provided.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described with reference to the accompanying drawings.

The dimension ratios shown in each of the figures do not always faithfully show the actual dimension ratios, but may show the dimension ratios in an exaggerated manner for the sake of explanation. In the following description, the concept of "upper" or "lower" does not necessarily indicate an absolute upper or lower position, but may indicate a relative upper or lower position in the posture shown in each figure.

First Preferred Embodiment

Figure 1:
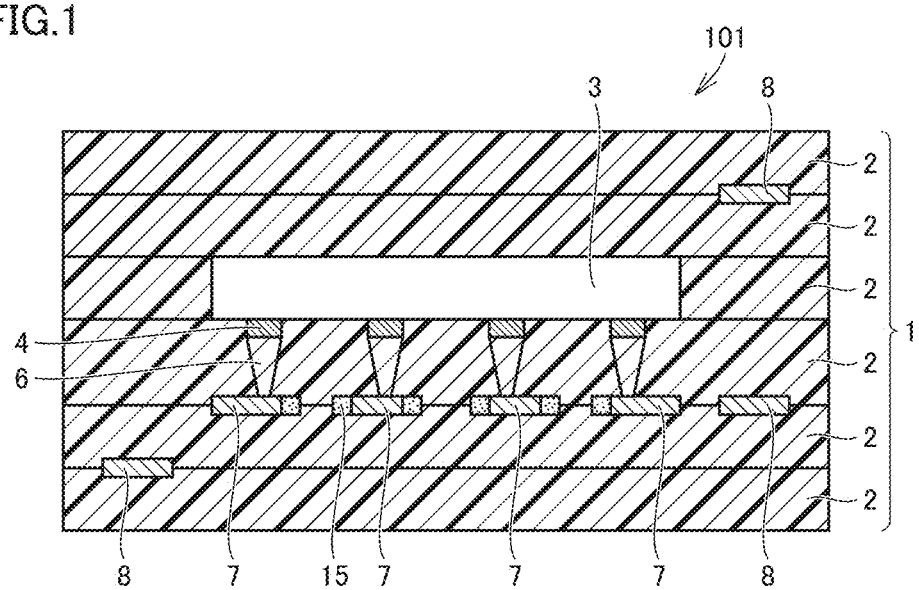
FIG. 1 is a cross-sectional view of a resin multilayer substrate according to a first preferred embodiment of the present invention.
Figure 2:
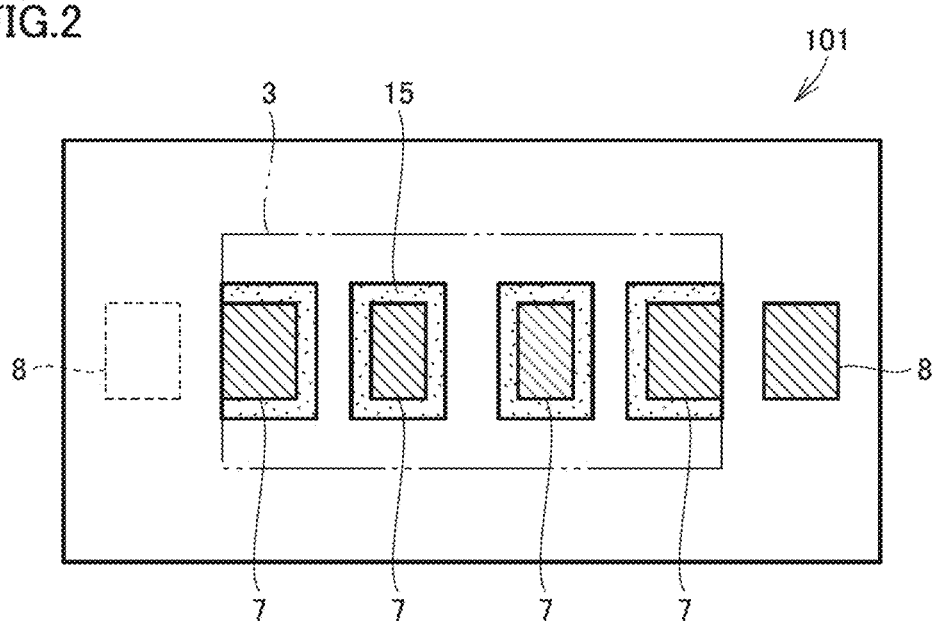
FIG. 2 is a plan view of a layer on which a first conductor pattern of the resin multilayer substrate in the first preferred embodiment of the present invention is disposed.

Referring to FIGS. 1 to 2, a resin multilayer substrate according to a first preferred embodiment of the present invention will be hereinafter described. FIG. 1 shows a cross-sectional view of a resin multilayer substrate 101 in the present preferred embodiment.

The resin multilayer substrate 101 in the present preferred embodiment includes a stacked body 1 including a plurality of resin layers 2 each made of a thermoplastic resin as a main material that are stacked; a component 3 embedded in the stacked body 1; one or more first conductor patterns 7 each disposed in a gap between the resin layers 2 inside the stacked body 1 and each having an outline in a view seen in one direction of the stacking direction of the stacked body 1; and one or more second conductor patterns 8 each disposed in a gap between the resin layers 2 inside the stacked body 1 and each having an outline in a view seen in one direction of the stacking direction of the stacked body 1. The thermoplastic resin as a main material of the resin layer 2 is preferably a liquid crystal polymer (LCP), for example. The plurality of resin layers 2 may have the same or substantially the same thickness. The plurality of resin layers may be a combination of resin layers that have different thicknesses.

The component 3 includes a lower surface provided with a plurality of electrodes 4. Each of the electrodes 4 is electrically connected through a conductor via 6 to the conductor pattern located therebelow. The shape and the structure of the component 3 shown herein are merely by way of example. The component may be provided with an electrode on any portion other than its lower surface. The shape of the component seen in a cross-sectional view is not necessarily limited to a rectangular or substantially rectangular shape.

In the example shown in FIG. 1, the first conductor pattern 7 is disposed on at least one interface inside the resin multilayer substrate 101. Then, FIG. 2 shows the positional relationship when this interface is seen from above in FIG. 1. The term "stacking direction" means an up-down direction in FIG. 1. The term "view seen in one direction of the stacking direction" means that stacked body 1 shown in FIG. 1 is seen from above or from below, for example. In this case, for the sake of explanation, the "view seen in one direction of the stacking direction" will be described with reference to a view seen from above in FIG. 1. The same also applies to the following preferred embodiments.

The conductor pattern is disposed at the interface between the resin layers 2 or disposed on the surface between resin the layers 2 exposed to the surface of the stacked body 1. In the following description, the flat plane inside the stacked body 1 or on the surface of the stacked body 1 on which a conductor pattern is located may be referred to as a "layer".

The conductor pattern may preferably be made of, for example, a metal foil or a metal film. The conductor pattern may be made of any kind of metals such as copper, aluminum, gold, or silver, for example.

As shown in FIG. 2, one or more first conductor patterns are disposed on one layer and one or more second conductor patterns 8 are also disposed on the same layer. As shown in FIGS. 1 and 2, at least one second conductor pattern 8 may also be disposed on each of layers at different heights in the resin multilayer substrate 101. In the example shown in FIGS. 1 and 2, all of the one or more first conductor patterns 7 are disposed at the same or substantially the same height, for example. At least one first conductor pattern 7 may be disposed at each of different heights. In FIG. 2, the component 3 is located closer to the viewer of the figure. The outline of component 3 projected onto this interface is shown by an alternate long and two short dashed line in FIG. 2.

As shown in FIG. 2, at least a portion of the outline of each of the first conductor patterns 7 overlaps with the component 3 in a view seen in one direction of the stacking direction of stacked body 1. The outline of each of the second conductor patterns 8 does not overlap with the component 3 in a view seen in one direction of the stacking direction of stacked body 1.

A resin portion 15 is adjacent to the outside of each of the first conductor patterns 7 along a portion of the outline of each of the first conductor patterns 7, the portion overlapping with component 3. The resin portion 15 is preferably made of a resin paste including thermoplastic resin powder, for example, liquid crystal polymer powder, as a main material. The liquid component of the resin paste does not substantially remain in resin portion 15. The resin portion 15 is not disposed in the portion extending along the outline of each second conductor pattern 8. This is due to the following reason. Specifically, when the resin portion 15 is disposed in the portion along the outline of each second conductor pattern 8, the resin portion 15 is to be disposed in a portion at which the above-described problem of non-joined state does not occur. This may lead to problems such as the stacked body may be needlessly increased in thickness; and the coplanarity of the surface of the stacked body may deteriorate.

Transfer of heat and pressure produced in the thermocompression bonding step to the portion overlapping with the component 3 is partially interrupted by the component 3, which may lead to an insufficient action of heat or pressure. This may result in formation of a non-joined portion in the vicinity of the outline of the first conductor pattern. In the present preferred embodiment, however, since the resin portion 15 is disposed in such a non-joined portion, the resin portion fills the gap in the vicinity of the outline of the conductor pattern. Therefore, it becomes possible to reduce or prevent the non-joined state between the resin layers in the portion that tends to be subjected to an insufficient action of heat or pressure by pressing in the thermocompression bonding step. As to the resin paste of the resin portion 15, the liquid component of the resin paste evaporates by heat and pressure produced in the thermocompression bonding step, with the result that the resin paste does not substantially remain.

Figure 3:
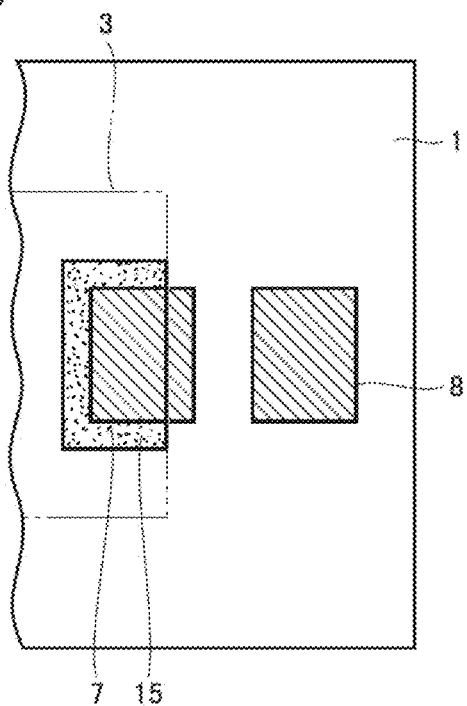
FIG. 3 is a plan view of a layer on which a first conductor pattern of a first modification of the resin multilayer substrate according to the first preferred embodiment of the present invention is disposed.
Figure 4:
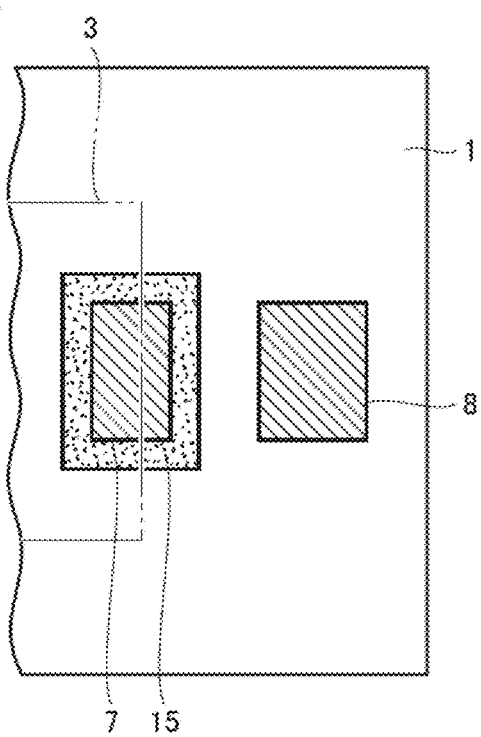
FIG. 4 is a plan view of a layer on which a first conductor pattern of a second modification of the resin multilayer substrate according to the first preferred embodiment of the present invention is disposed.

In the example shown in FIG. 2, at least one first conductor pattern 7 is disposed at the position at which the outline of the first conductor pattern 7 overlaps with the outline of the component 3, but this positional relationship is merely by way of example. For example, as shown in FIG. 3, at least one first conductor pattern 7 may be located so as to be bridged over the outline of the component 3. In this case, as shown in FIG. 3, the resin portion 15 may be disposed along only a portion of the outline of first conductor pattern 7, the portion overlapping with the component 3. The resin portion 15 does not have to be disposed in a portion of the outline of the first conductor pattern 7, which does not overlap with the component 3, though not limited thereto. For example, as shown in FIG. 4, at least one first conductor pattern 7 is located so as to be bridged over the outline of the component 3. Also, the resin portion 15 may be disposed on the outline of the first conductor pattern 7 so as to extend not only along the portion overlapping with the component 3 but also along the portion not overlapping with the component 3. Also in the case shown in FIGS. 3 and 4, the resin portion 15 is not disposed along the outline of the second conductor pattern 8, which does not include a portion overlapping with the component 3.

The resin portion 15 preferably is formed by applying a resin paste onto a desired region and then evaporating the liquid component in the resin paste. Accordingly, the resin portion 15 is formed in the state in which the liquid component in the resin paste does not substantially remain, that is, the state in which only the resin component in the resin paste substantially remains. The resin paste of the resin portion 15 may preferably be made by dispersing powdered thermoplastic resin, for example, powdered liquid crystal polymer, in a liquid. Examples of the liquid component in which the powdered thermoplastic resin is dispersed, that is, a dispersion medium, may be ethanol, terpineol, butyrolactone, isopropyl alcohol, and other suitable medium, for example. It is preferable that the above-described liquid component does not include a binder.

When powdered liquid crystal polymer is used as the powdered thermoplastic resin described herein, it is preferable that the powdered liquid crystal polymer is surface-treated by plasma or ultraviolet light. When powdered liquid crystal polymer is surface-treated by plasma or ultraviolet light, the joining performance is improved. By using the material surface-treated in this manner as a material of the resin paste, the joining performance between the liquid crystal polymer particles is improved, to thus improve the strength of the resin portion 15 itself. Furthermore, since the joining performance between the liquid crystal polymer particles and the surface of the resin layer 2 is also improved, the joining strength between the resin portion 15 and the resin layer 2 is also improved. The above-described effect is increased particularly when the resin layer 2 is made of liquid crystal polymers. As a result, a resin multilayer substrate with increased strength overall is able to be obtained. The joining performance improving effect is greater when the powdered liquid crystal polymer is surface-treated by ultraviolet light than when the powdered liquid crystal polymer is surface-treated by plasma. Thus, the surface treatment by ultraviolet light is more preferable.

It is preferable that the resin paste of the resin portion 15 includes liquid crystal polymer in varnish form. The liquid crystal polymer in varnish form is obtained by dissolving a solvent-soluble liquid crystal polymer in a solvent. The liquid crystal polymer in varnish form is different from a liquid in which powdered liquid crystal polymer is dispersed, but is a solvent in which individual particles are completely dissolved. When the liquid crystal polymer in varnish form is used in this manner, it is preferable to select, as a solvent, a solvent that does not dissolve the resin layer 2. In other words, when n-methyl pyrrolidone is used as a solvent, for example, it is preferable that a solvent-insoluble liquid crystal polymer is used as the resin layer 2 while a liquid crystal polymer that is soluble in the solvent and includes an amide bond, for example, in a portion of the molecular structure is used as a resin paste for the material of the resin portion 15.

It is preferable that the resin paste used for the resin portion 15 includes fibrillated liquid crystal polymer powder. When a resin paste is produced, the fibrillated liquid crystal polymer powder is included in this manner, thus facilitating passing of the paste through the screen printing mesh, for example. Furthermore, by including the fibrillated liquid crystal polymer powder in this manner, the viscosity of the resin paste is able to be readily increased. Furthermore, the fibrillated liquid crystal polymer powder is greatly changed in thickness by compression, as compared with spherical or granular liquid crystal polymer powder, for example. Thus, even when this fibrillated liquid crystal polymer powder is thickly applied, the resin portion 15 is able to be readily formed to have the same or approximately the same thickness as the conductor pattern as the resin portion 15 at the point of time when the thermocompression bonding step ends.

Second Preferred Embodiment

Figure 5:
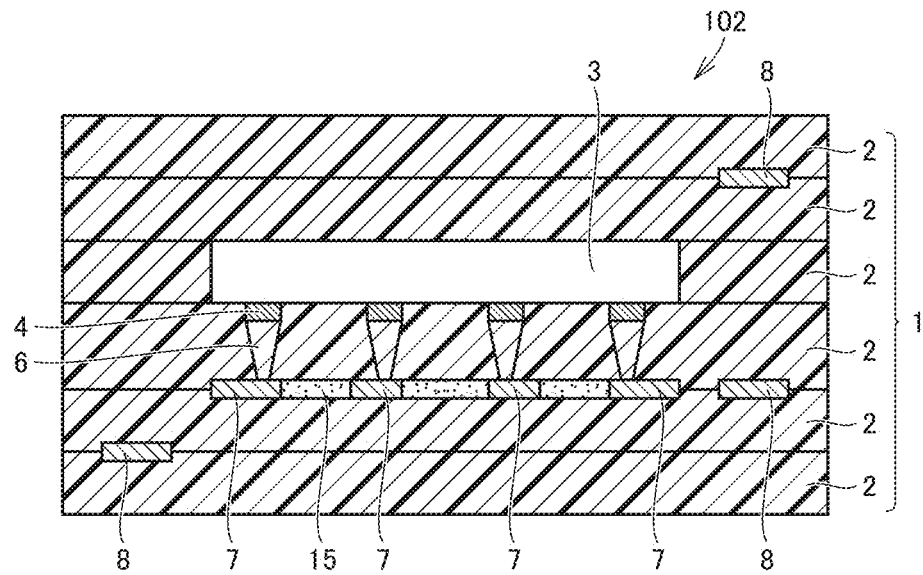
FIG. 5 is a cross-sectional view of a resin multilayer substrate according to a second preferred embodiment of the present invention.
Figure 6:
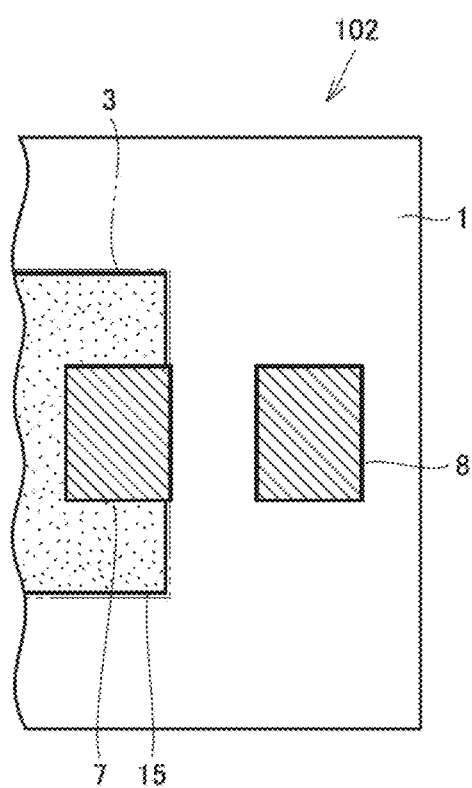
FIG. 6 is a plan view of a layer on which a first conductor pattern of the resin multilayer substrate in the second preferred embodiment of the present invention is disposed.

Referring to FIGS. 5 and 6, a resin multilayer substrate according to a second preferred embodiment of the present invention will be described hereinafter. FIG. 5 shows a cross-sectional view of a resin multilayer substrate 102 in the present preferred embodiment.

In resin multilayer substrate 101 (see FIG. 1) in the first preferred embodiment, the resin portion 15 has a fixed width so as to extend along a portion of the outline of the first conductor pattern 7, the portion overlapping with component 3. As shown in FIG. 5, however, in the resin multilayer substrate 102 in the present preferred embodiment, the resin portion 15 is disposed in the region overlapping with component 3 so as to cover the entire or substantially the entire region not covered by the first conductor pattern 7. The resin portion 15 may be provided in the manner as described above.

FIG. 6 shows the positional relationship in a top view of the layer of the resin multilayer substrate 102 on which the first conductor pattern 7 is disposed as shown in FIG. 5. In FIG. 6, the outline of the resin portion 15 is slightly displaced from the outline of the component 3 for the sake of explanation, but these outlines may be aligned with each other.

The present preferred embodiment also achieves the same or substantially the same advantageous effects as those in the first preferred embodiment.

Third Preferred Embodiment

Figure 7:
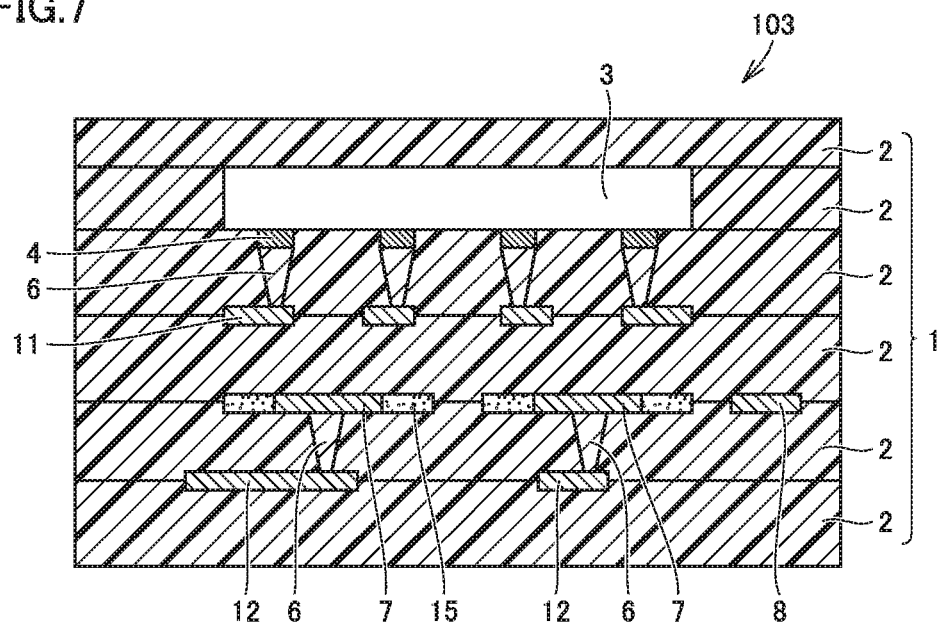
FIG. 7 is a cross-sectional view of a resin multilayer substrate according to a third preferred embodiment of the present invention.

Referring to FIG. 7, a resin multilayer substrate according to a third preferred embodiment of to the present invention will be hereinafter described. FIG. 7 shows a cross-sectional view of a resin multilayer substrate 103 in the present preferred embodiment.

In the resin multilayer substrate 101 in the first preferred embodiment, the first conductor pattern 7 is located below component 3 and closest to component 3. In the present preferred embodiment, however, another conductor pattern 11 is located between the first conductor pattern 7 and the component 3. An electrode 4 provided on the lower surface of the component 3 is electrically connected to the conductor pattern 11 through a conductor via 6. The conductor pattern 11 and the first conductor pattern 7 may be electrically connected to each other or do not have to be electrically connected to each other. In this manner, there may be a configuration in which the conductor pattern located closest to the component 3 is not the first conductor pattern 7. In other words, a conductor pattern other than the first conductor pattern 7 may be located between the first conductor pattern 7 and the component 3. In resin multilayer substrate 103 shown in FIG. 7, the first conductor pattern 7 is electrically connected through the conductor via 6 to another conductor pattern 12 located further below. This merely shows an example without being limited to such a configuration.

All of the conductor patterns disposed inside stacked body 1 are not necessarily classified into one of the first conductor pattern and the second conductor pattern. Similar to the conductor pattern 11 as described above, there also may be a conductor pattern located inside stacked body 1 but not corresponding to the first conductor pattern and the second conductor pattern.

All of the conductor patterns each having an outline at least partially overlapping with the component in a top view are not necessarily the first conductor pattern. Similar to the above-described conductor pattern 11, there may be a conductor pattern that has an outline at least partially overlapping with the component but that does not correspond to the first conductor pattern.

The present preferred embodiment also achieves the same or substantially the same advantageous effects as those in the first preferred embodiment.

Fourth Preferred Embodiment

Figure 8:
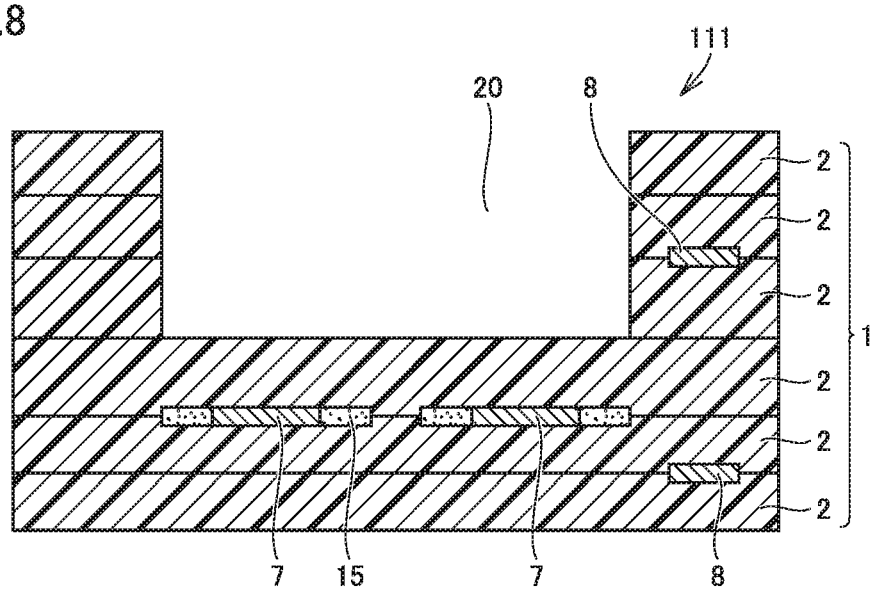
FIG. 8 is a cross-sectional view of a resin multilayer substrate according to a fourth preferred embodiment of the present invention.

Referring to FIG. 8, a resin multilayer substrate according to a fourth preferred embodiment of the present invention will be hereinafter described. FIG. 8 shows a cross-sectional view of a resin multilayer substrate 111 in the present preferred embodiment. The resin multilayer substrate 111 includes a cavity 20. The cavity is a recessed portion. A portion of the stacked body 1 is recessed to thus define the cavity 20. The number of stacked resin layers 2 may be different between the portion including the cavity 20 and the portion not including the cavity 20. In the present preferred embodiment, the cavity 20 may also be regarded as a lower region surrounded by a high portion. The cavity 20 may include an outer circumference that is completely surrounded by a higher portion in a view seen in one direction of the stacking direction or may include an outer circumference that is only partially in contact with the higher portion. In other words, the "cavity" in preferred embodiments of the present invention means a recessed portion that includes an outer circumference at least partially in contact with the higher portion. In a view seen in one direction of the stacking direction, a portion of the sides of the cavity may be continuous to the end of the stacked body.

The resin multilayer substrate 111 includes a stacked body 1 including a plurality of resin layers 2 each made of a thermoplastic resin as a main material that are stacked; a cavity 20 provided in stacked body 1 so as to be recessed in the stacking direction; one or more first conductor patterns 7 each disposed in a gap between resin layers 2 inside stacked body 1 and each having an outline in a view seen in one direction of the stacking direction of stacked body 1; and one or more second conductor patterns 8 each disposed in a gap between resin layers 2 inside stacked body 1 and each having an outline in a view seen in one direction of the stacking direction of stacked body 1. At least a portion of the outline of each of first conductor patterns 7 overlaps with the cavity 20 in a view seen in one direction of the stacking direction of stacked body 1. The outline of each second conductor pattern 8 does not overlap with the cavity 20 in a view seen in one direction of the stacking direction of stacked body 1. The resin portion 15 is adjacent to the outside of each first conductor pattern 7 along a portion of the outline of each first conductor pattern 7, the portion overlapping with cavity 20. The resin portion 15 is preferably made of a resin paste including thermoplastic resin powder, for example, liquid crystal polymer powder, as a main material. The liquid component of the resin paste does not substantially remain in resin portion 15. The resin portion 15 is not disposed in the portion along the outline of each second conductor pattern 8.

In the resin multilayer substrate 111 shown in FIG. 8, one or more second conductor patterns 8 are located in layers different from the layer in which each first conductor pattern 7 is located, for example. At least one second conductor pattern 8 may be located in the same layer as the first conductor pattern 7.

There may be a case in which heat or pressure by pressing is less likely to be transferred to the bottom of the cavity in the portion overlapping with the cavity 20. This may lead to an insufficient action of heat or pressure in the thermocompression bonding step. As a result, there is a possibility that a non-joined portion may be provided in the vicinity of the outline of the first conductor pattern. However, in the present preferred embodiment, the resin portion 15 is disposed in such a non-joined portion, so that the resin portion fills the gap in the vicinity of the outline of the conductor pattern. Therefore, it becomes possible to reduce or prevent the non-joined state between the resin layers in the portion that tends to be subjected to an insufficient action of heat or pressure by pressing in the thermocompression bonding step.

Figure 9:
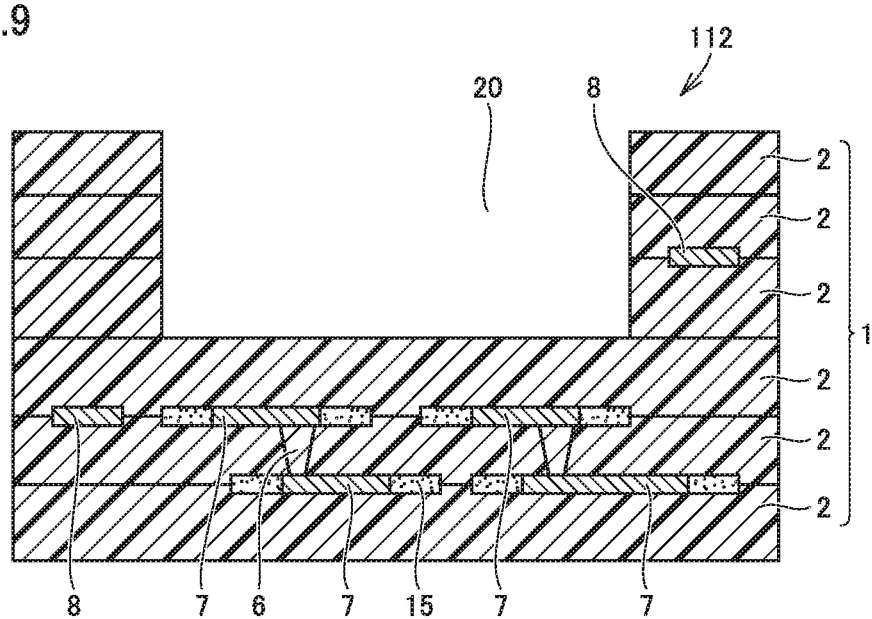
FIG. 9 is a cross-sectional view of a modification of the resin multilayer substrate according to the fourth preferred embodiment of the present invention.

As a modification of the resin multilayer substrate in the present preferred embodiment, a resin multilayer substrate as shown in FIG. 9 is also conceivable. FIG. 9 shows a resin multilayer substrate 112. The resin multilayer substrate 112 includes a first conductor pattern 7 in each of two layers. One or more first conductor patterns 7 are disposed in each layer. In this manner, a plurality of first conductor patterns 7 are disposed separately in a plurality of layers. This is also applicable not only to the fourth preferred embodiment but also to other preferred embodiments.

Fifth Preferred Embodiment

Figure 10:
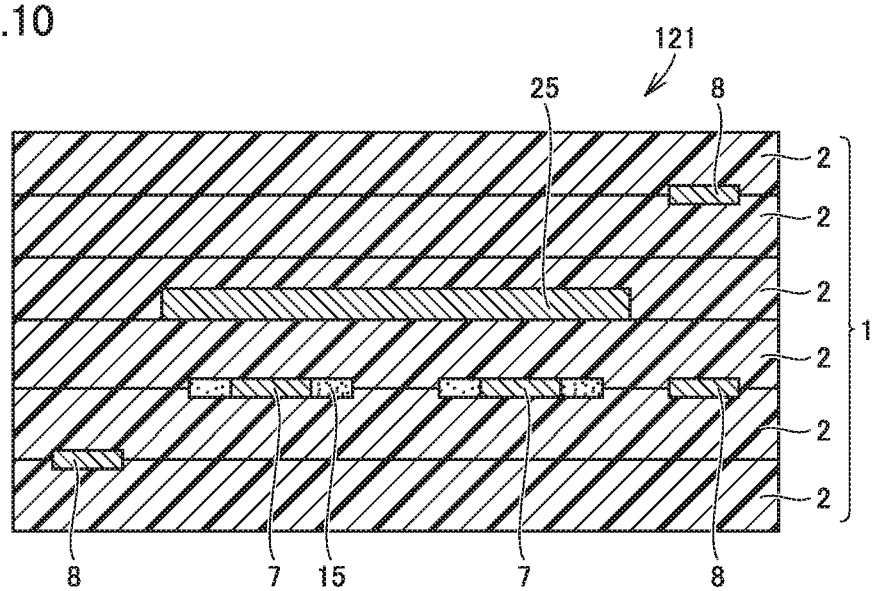
FIG. 10 is a cross-sectional view of a resin multilayer substrate according to a fifth preferred embodiment of the present invention.

Referring to FIG. 10, a resin multilayer substrate according to a fifth preferred embodiment of the present invention will be hereinafter described. FIG. 10 shows a cross-sectional view of a resin multilayer substrate 121 in the present preferred embodiment. The resin multilayer substrate 121 includes a first conductive foil 25. The first conductive foil 25 has the largest thickness among the conductive foils included in the resin multilayer substrate 121. The concept of the conductive foil in this case includes a conductor pattern. The first conductive foil 25 is also referred to as a "maximum thickness conductive foil". The first conductive foil 25 may preferably be a copper foil, for example. When the first conductive foil 25 is made of copper, the first conductive foil 25 is also referred to as a "maximum thickness copper foil".

The resin multilayer substrate 121 includes a stacked body 1 including a plurality of resin layers 2 each made of a thermoplastic resin as a main material that are stacked; a first conductive foil 25 embedded in stacked body 1; one or more first conductor patterns 7 each disposed in a gap between the resin layers 2 inside the stacked body 1 and each having an outline in a view seen in one direction of the stacking direction of the stacked body 1; and one or more second conductor patterns 8 each disposed in a gap between the resin layers 2 inside stacked body 1 and each having an outline in a view seen in one direction of the stacking direction of the stacked body 1.

The first conductive foil 25 is thicker than each of the one or more first conductor patterns 7 and the one or more second conductor patterns 8. At least a portion of the outline of each of the first conductor patterns 7 overlaps with the first conductive foil 25 in a view seen in one direction of the stacking direction of the stacked body 1. The outline of each second conductor pattern 8 does not overlap with the first conductive foil 25 in a view seen in one direction of the stacking direction of the stacked body 1.

The resin portion 15 is adjacent to the outside of each first conductor pattern 7 along a portion of the outline of each first conductor pattern 7, the portion overlapping with the first conductive foil 25. The resin portion 15 preferably is made of a resin paste including thermoplastic resin powder, for example, liquid crystal polymer powder, as a main material. The liquid component of the resin paste does not substantially remain in the resin portion 15. The resin portion 15 is not disposed in the portion along the outline of each second conductor pattern 8.

The portion overlapping with the first conductive foil 25 may be subjected to an insufficient action of heat or pressure in the thermocompression bonding step. As a result, there is a possibility that a non-joined portion may be provided in the vicinity of the outline of the first conductor pattern. However, in the present preferred embodiment, the resin portion 15 is disposed in such a non-joined portion, so that the resin portion fills the gap in the vicinity of the outline of the first conductor pattern. Therefore, it becomes possible to reduce or prevent the non-joined state between the resin layers in the portion that tends to be subjected to an insufficient action of heat or pressure by pressing in the thermocompression bonding step.

Figure 11:
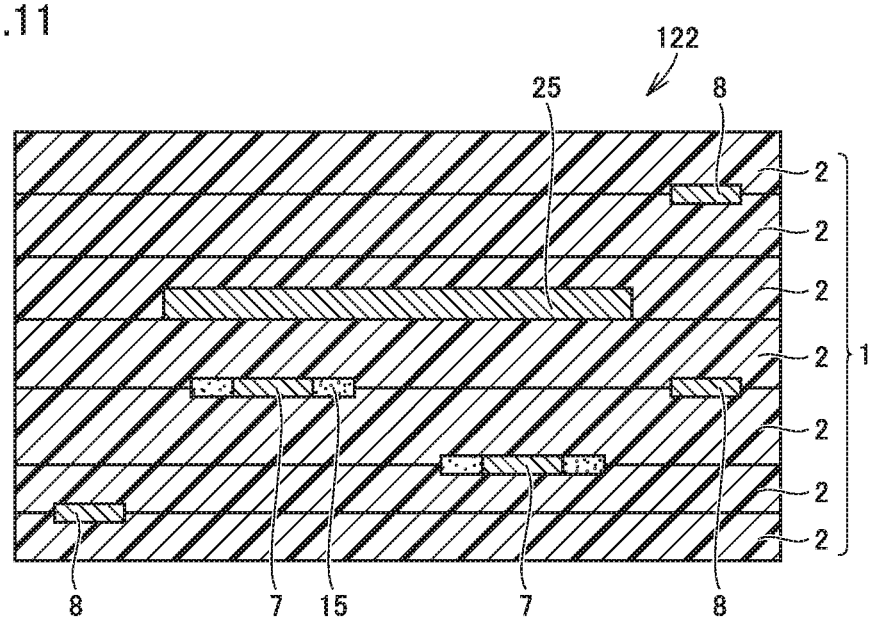
FIG. 11 is a cross-sectional view of a first modification of the resin multilayer substrate in the fifth preferred embodiment of the present invention.

As a modification of the resin multilayer substrate in the present preferred embodiment, a resin multilayer substrate as shown in FIG. 11 is also conceivable. FIG. 11 shows a resin multilayer substrate 122. Resin multilayer substrate 122 includes a first conductor pattern 7 in each of two layers. In this manner, a plurality of first conductor patterns 7 may be disposed separately in a plurality of layers.

Figure 12:
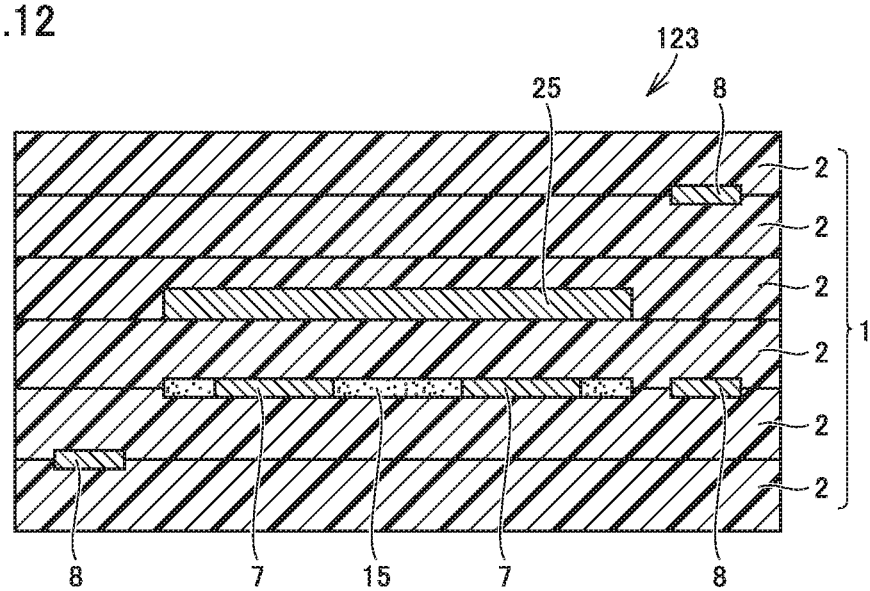
FIG. 12 is a cross-sectional view of a second modification of the resin multilayer substrate in the fifth preferred embodiment of the present invention.

As a modification of the resin multilayer substrate in the present preferred embodiment, a resin multilayer substrate as shown in FIG. 12 is also conceivable. FIG. 12 shows a resin multilayer substrate 123. In the resin multilayer substrate 123, every region other than the first conductor pattern 7 in a portion overlapping with first conductive foil 25 is covered by the resin portion 15. Such a configuration may be provided.

Figure 13:
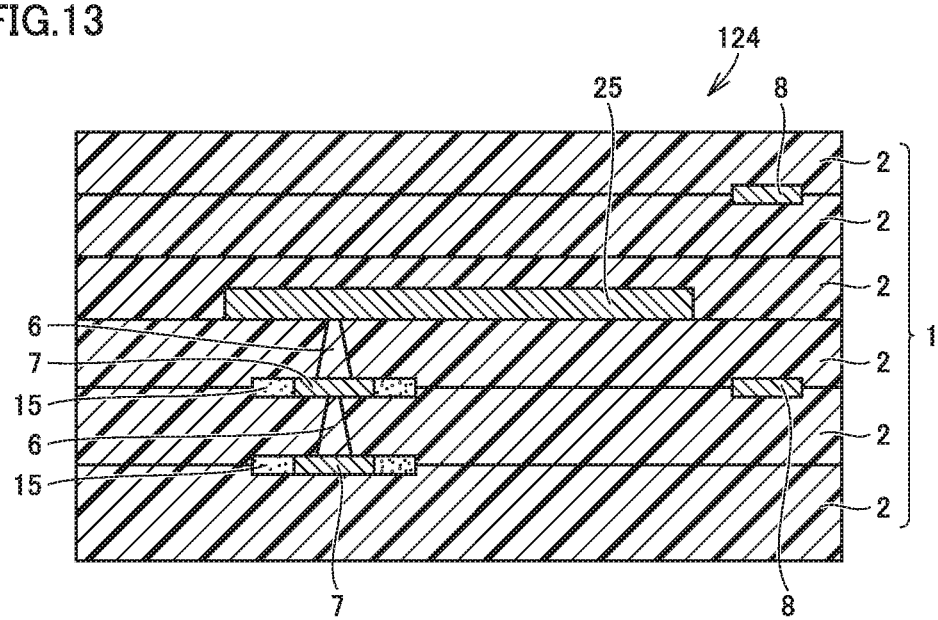
FIG. 13 is a cross-sectional view of a third modification of the resin multilayer substrate in the fifth preferred embodiment of the present invention.

As a modification of the resin multilayer substrate in the present preferred embodiment, a resin multilayer substrate as shown in FIG. 13 is also conceivable. FIG. 13 shows a resin multilayer substrate 124. In the resin multilayer substrate 124, a first conductive foil 25 is electrically connected to at least one of the first conductor patterns 7 through a conductor via 6. The plurality of first conductor patterns 7 are disposed separately in different layers. The first conductor patterns 7 located in different layers are electrically connected to each other through the conductor via 6.

In this case, for the sake of explanation, the first conductive foil 25 and the first conductor pattern 7, which is located only below the first conductive foil 25, are disposed. However, the first conductor pattern 7 may be disposed above the first conductive foil 25. The first conductor pattern 7 may be disposed both above and below the first conductive foil 25. In this case, for example, the first conductive foil 25 may be connected through the conductor via 6 to the first conductor pattern 7 located below the first conductive foil 25 while the first conductive foil 25 may be connected through the conductor via 6 to the first conductor pattern 7 located above the first conductive foil 25.

Figure 14:
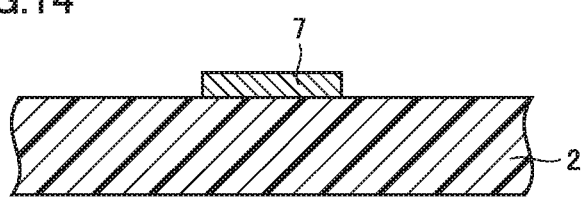
FIG. 14 is a first explanatory diagram of a method of manufacturing a resin multilayer substrate according to a preferred embodiment of the present invention.

One non-limiting example of a method of manufacturing a resin multilayer substrate will be hereinafter described. The example manufacturing method is also applicable to the following preferred embodiments. In order to manufacture a resin multilayer substrate, a resin sheet provided with a conductive foil is first prepared. The conductive foil may preferably be a metal foil, for example. The conductive foil may be a copper foil, for example. At this point in time, the entire or substantially the entire surface of the resin sheet may be covered by a conductive foil. A resist pattern is printed on the surface of the conductive foil of the resin sheet provided with the conductive foil. The resist pattern herein means a pattern formed by a resist layer having the shape corresponding to a desired conductor pattern. Then, the conductive foil not covered by a resist is removed by acid while using a resist pattern as a mask. The acid may be HCl, for example. Then, the resist pattern is removed by an alkaline liquid. A neutralization treatment is performed as required. In this manner, a portion of the remaining conductive foil having a desired shape, that is, a conductor pattern, is obtained on the surface of the resin sheet. In this case, a plurality of conductor patterns are formed. The plurality of conductor patterns include a first conductor pattern 7 and a second conductor pattern 8. The resin sheet is provided as a resin layer 2. By way of example, FIG. 14 shows the state in which the first conductor pattern 7 is disposed on the surface of the resin layer 2.

Starting from the surface of resin layer 2 on which no conductor pattern is formed, laser machining is applied. A through hole is provided in the resin sheet by the laser machining. This through hole is filled with a conductor paste. Thus, a conductor via is formed in a required portion of the resin sheet.

Figure 15:
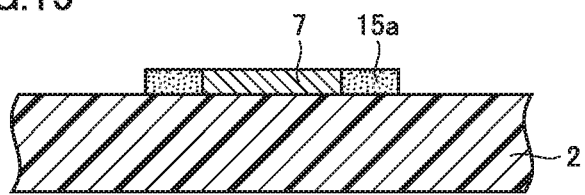
FIG. 15 is a second explanatory diagram of a method of manufacturing a resin multilayer substrate according to a preferred embodiment of the present invention.
Figure 16:
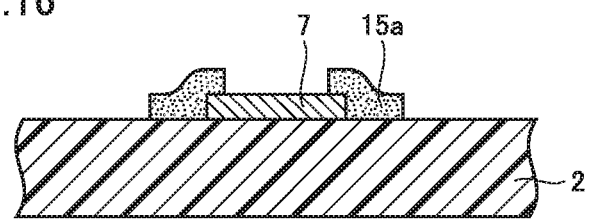
FIG. 16 is a third explanatory diagram of a method of manufacturing a resin multilayer substrate according to a preferred embodiment of the present invention.

Then, a resin paste is applied onto the surface of the resin sheet finished thus far. The resin paste may be applied by known techniques. The resin paste may be applied by screen printing, for example. The resin paste is disposed along a portion of or the entire outline of the conductor pattern. By way of example, FIG. 15 shows the state in which the first conductor pattern 7 is disposed on the surface of resin layer 2 while resin paste 15*a* is disposed so as to extend along the outline of first conductor pattern 7. When the resin paste 15*a* is disposed, a portion of the resin paste 15*a* may cover the end of the first conductor pattern 7, for example, as shown in FIG. 16.

Figure 17:
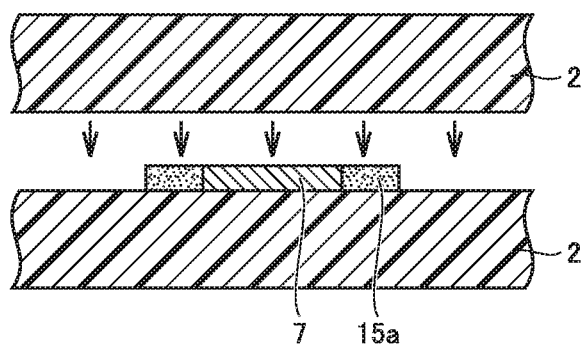
FIG. 17 is a fourth explanatory diagram of a method of manufacturing a resin multilayer substrate according to a preferred embodiment of the present invention.

The resin sheets subjected to the processes conducted thus far are stacked. FIG. 17 shows the state in the vicinity of one first conductor pattern 7 by way of example. Another resin layer 2 is overlaid from above as shown by arrows.

Figure 18:
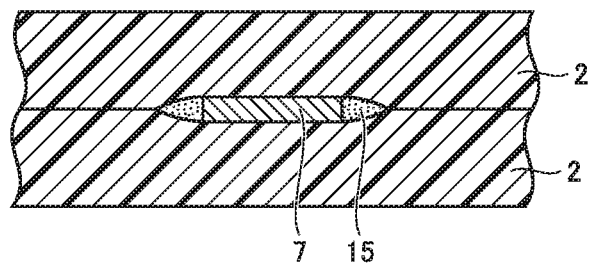
FIG. 18 is a fifth explanatory diagram of a method of manufacturing a resin multilayer substrate according to a preferred embodiment of the present invention.

The stacked product is subjected to a thermocompression bonding step. Thus, the resin paste disposed partially or entirely along the outline of the conductor pattern is deformed by heat and pressure, to thus form a resin portion 15 that fills the gap between the resin layers or the gap between the conductor pattern and the resin layer, as shown in FIG. 18. In this case, any liquid component does not substantially remain in resin portion 15. Then, the stacked body 1 is integrated to form a resin multilayer substrate. Due to this deformation, even when a portion of the resin paste covers the end of first conductor pattern 7, the resin paste flows to the outside of the outline of first conductor pattern 7. Furthermore, each resin sheet is formed as the resin layer 2. The conductor paste forming a conductor via is hardened to produce a conductor via.

Figure 19:
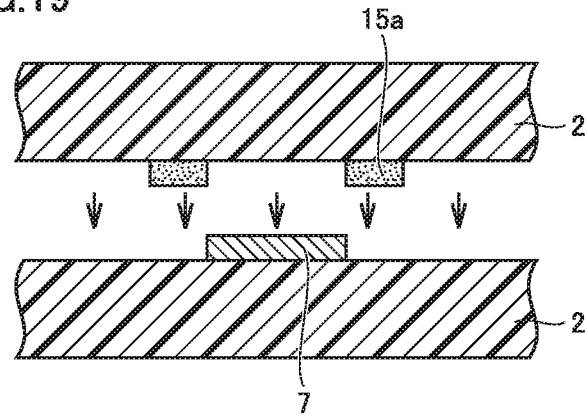
FIG. 19 is a sixth explanatory diagram of a method of manufacturing a resin multilayer substrate according to a preferred embodiment of the present invention.

In FIGS. 15 and 17, the first conductor pattern 7 is formed on the surface of the resin layer 2 while the resin paste 15*a* surrounds the first conductor pattern 7, but without being limited thereto, the method as shown in FIG. 19 may also be applicable. In other words, the first conductor pattern 7 is formed on the surface of the resin layer 2 while the resin paste 15*a* is disposed not on the surface of the resin layer 2 including the first conductor pattern 7 formed thereon, but on the surface of another resin layer 2. The resin paste 15*a* is disposed in the shape corresponding to the outline of the first conductor pattern 7. As shown in FIG. 19, a first resin layer 2 including the first conductor pattern 7 disposed thereon and a second resin layer 2 including the resin paste 15*a* disposed thereon are superimposed on each other and thermocompression-bonded to each other, so that the state as shown in FIG. 18 is obtained. The method as described above may also be used.

Sixth Preferred Embodiment

Figure 20:
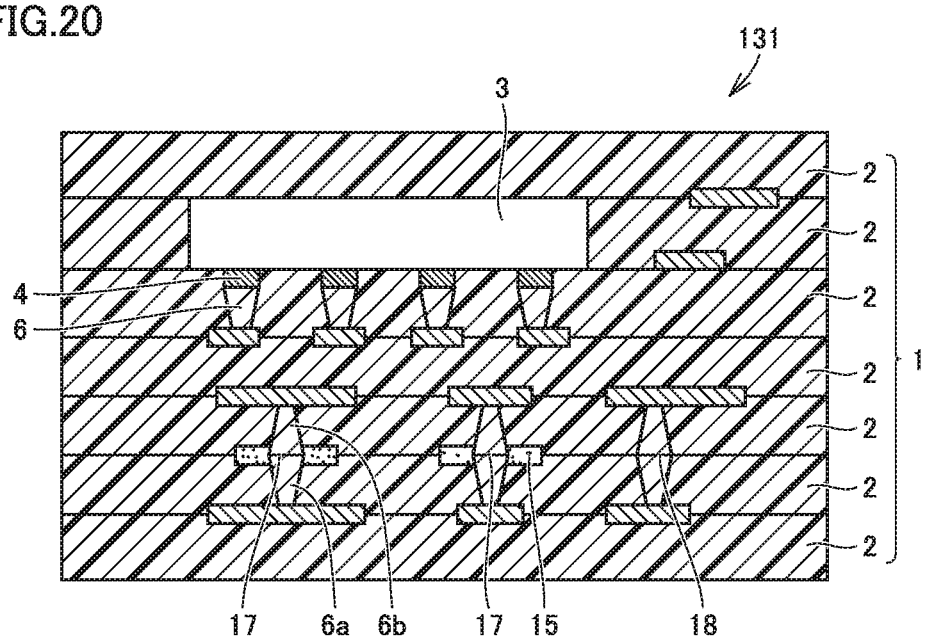
FIG. 20 is a cross-sectional view of a resin multilayer substrate according to a sixth preferred embodiment of the present invention.

Referring to FIG. 20, a resin multilayer substrate according to a sixth preferred embodiment of the present invention will be hereinafter described. FIG. 20 shows a cross-sectional view of a resin multilayer substrate 131 in the present preferred embodiment. The resin multilayer substrate 131 includes a component 3. The resin multilayer substrate 131 includes a conductor-via first joint portion 17 and a conductor-via second joint portion 18.

The resin multilayer substrate 131 includes a stacked body 1 including a plurality of resin layers 2 each made of a thermoplastic resin as a main material that are stacked; a component 3 embedded in the stacked body 1; the one or more conductor-via first joint portions 17 each corresponding to a joining portion between the conductor vias each penetrating through one of the plurality of resin layers 2 inside the stacked body 1 such that the conductor vias are continuous to each other in the stacking direction of stacked body 1, the one or more conductor-via first joint portions 17 each having an outline of the joining surface in a view seen in one direction of the stacking direction of the stacked body 1; and the one or more conductor-via second joint portions 18 each corresponding to a joining portion between the conductor vias each penetrating through one of the plurality of resin layers 2 inside stacked body 1 such that the conductor vias are continuous to each other in the stacking direction of stacked body 1, the one or more conductor-via second joint portions 18 each having an outline of the joining surface in a view seen in one direction of the stacking direction of the stacked body 1. In the conductor-via first joint portion 17, a conductor via 6*a* and a conductor via 6*b* are joined to each other. The conductor via 6*a* has a tapered shape having a diameter that is increased upward in FIG. 20. The conductor via 6*b* has a tapered shape having a diameter that is increased downward in FIG. 20. In the conductor-via first joint portion 17, the end surface of the conductor via 6*a* with a larger diameter and the end surface of the conductor via 6*b* with a larger diameter are joined to face each other. The same also applies to the conductor-via second joint portion 18.

At least a portion of the outline of each conductor-via first joint portion 17 overlaps with the component 3 in a view seen in one direction of the stacking direction of stacked body 1. The outline of each conductor-via second joint portion 18 does not overlap with the component 3 in a view seen in one direction of the stacking direction of the stacked body 1. A resin portion 15 is adjacent to the outside of each conductor-via first joint portion 17 along a portion of the outline of each conductor-via first joint portion 17, the portion overlapping with the component 3. The resin portion 15 is preferably made of a resin paste including thermoplastic resin powder, for example, liquid crystal polymer powder, as a main material. The liquid component of the resin paste does not substantially remain in the resin portion 15. The resin portion 15 is not disposed in the portion along the outline of each conductor-via second joint portion 18.

Since transfer of the heat and the pressure produced in the thermocompression bonding step to the portion overlapping with component 3 is partially interrupted by the component 3, which may lead to an insufficient action of heat or pressure. This may result in a non-joined portion in the resin layer in the vicinity of the conductor-via first joint portion. In the present preferred embodiment, however, the resin portion 15 is disposed in such a non-joined portion, so that the resin portion fills the gap in the vicinity of the outline of the joint portion between the conductor vias. Therefore, it is possible to reduce or prevent the non-joined state between the resin layers in the portion that tends to be subjected to an insufficient action of heat or pressure by pressing in the thermocompression bonding step.

Seventh Preferred Embodiment

Figure 21:
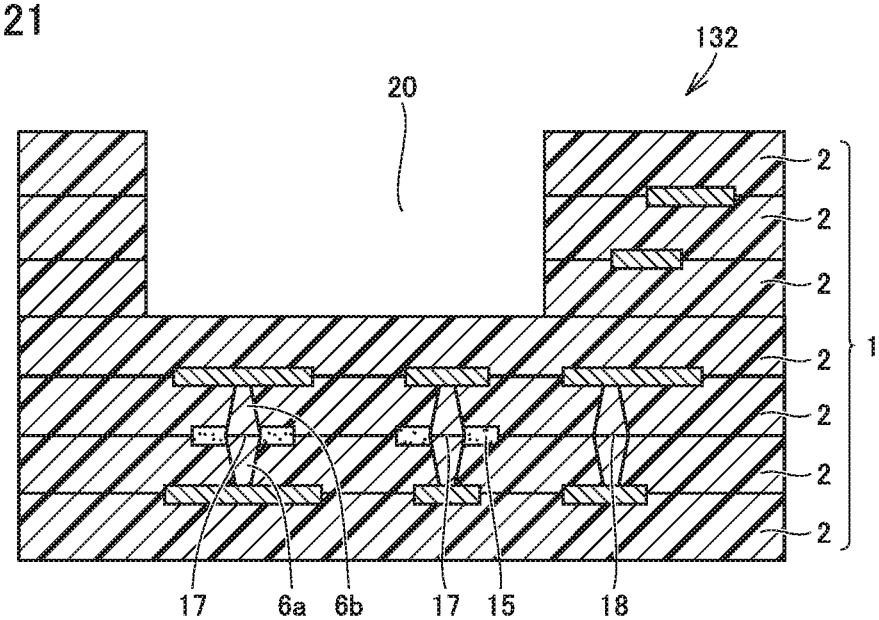
FIG. 21 is a cross-sectional view of a resin multilayer substrate according to a seventh preferred embodiment of the present invention.

Referring to FIG. 21, a resin multilayer substrate according to a seventh preferred embodiment of the present invention will be hereinafter described. FIG. 21 shows a cross-sectional view of a resin multilayer substrate 132 in the present preferred embodiment. The resin multilayer substrate 132 includes a cavity 20. The resin multilayer substrate 132 includes a conductor-via first joint portion 17 and a conductor-via second joint portion 18.

The resin multilayer substrate 132 includes a stacked body 1 including a plurality of resin layers 2 each made of a thermoplastic resin as a main material that are stacked; a cavity 20 provided in the stacked body 1 so as to be recessed in the stacking direction; one or more conductor-via first joint portions 17 each corresponding to a joining portion between conductor vias each penetrating through one of the plurality of resin layers 2 inside stacked body 1 such that the conductor vias are continuous to each other in the stacking direction of the stacked body 1, the one or more conductor-via first joint portions 17 each having an outline of the joining surface in a view seen in one direction of the stacking direction of the stacked body 1; and one or more conductor-via second joint portions 18 each corresponding to a joining portion between conductor vias each penetrating through one of the plurality of resin layers 2 inside the stacked body 1 such that the conductor vias are continuous to each other in the stacking direction of the stacked body 1, the one or more conductor-via second joint portions 18 each having an outline of the joining surface in a view seen in one direction of the stacking direction of the stacked body 1.

At least a portion of the outline of each conductor-via first joint portion 17 overlaps with the cavity 20 in a view seen in one direction of the stacking direction of the stacked body 1. The outline of each conductor-via second joint portion 18 does not overlap with the cavity 20 in a view seen in one direction of the stacking direction of the stacked body 1. A resin portion 15 is adjacent to the outside of each conductor-via first joint portion 17 along a portion of the outline of each conductor-via first joint portion 17, the portion overlapping with the cavity 20. The resin portion 15 is preferably made of a resin paste including thermoplastic resin powder, for example, liquid crystal polymer powder, as a main material. The liquid component of the resin paste does not substantially remain in the resin portion 15. The resin portion 15 is not disposed in the portion along the outline of each conductor-via second joint portion 18.

There is a possibility that the portion overlapping with the cavity 20 may be subjected to an insufficient action of heat or pressure in the thermocompression bonding step. This may result in a non-joined portion in the resin layer in the vicinity of the conductor-via first joint portion. In the present preferred embodiment, however, the resin portion 15 is disposed in such a non-joined portion, so that the resin portion fills the gap in the vicinity of the outline of the joint portion between the conductor vias. Therefore, it becomes possible to reduce or prevent the non-joined state between the resin layers in the portion that tends to be subjected to an insufficient action of heat or pressure by pressing in the thermocompression bonding step.

Eighth Preferred Embodiment

Figure 22:
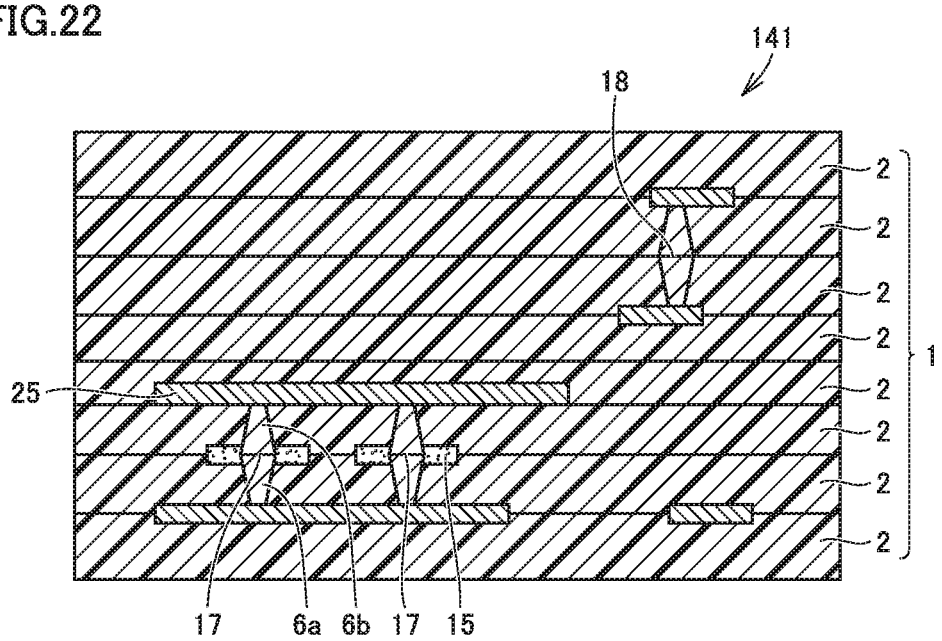
FIG. 22 is a cross-sectional view of a resin multilayer substrate according to an eighth preferred embodiment of the present invention.

Referring to FIG. 22, a resin multilayer substrate according to an eighth preferred embodiment of the present invention will be hereinafter described. FIG. 22 shows a cross-sectional view of a resin multilayer substrate 141 in the present preferred embodiment. The resin multilayer substrate 141 includes a first conductive foil 25. The resin multilayer substrate 141 includes a conductor-via first joint portion 17 and a conductor-via second joint portion 18.

The resin multilayer substrate 141 includes a stacked body 1 including a plurality of resin layers 2 each made of a thermoplastic resin as a main material that are stacked; a first conductive foil 25 embedded in the stacked body 1; one or more conductor-via first joint portions 17 each corresponding to a joining portion between conductor vias each penetrating through one of the plurality of resin layers 2 inside the stacked body 1 such that the conductor vias are continuous to each other in the stacking direction of the stacked body 1, the one or more conductor-via first joint portions 17 each having an outline of the joining surface in a view seen in one direction of the stacking direction of the stacked body 1; and one or more conductor-via second joint portions 18 each corresponding to a joining portion between conductor vias each penetrating through one of the plurality of resin layers 2 inside stacked body 1 such that the conductor vias are continuous to each other in the stacking direction of the stacked body 1, the one or more conductor-via second joint portions 18 each having an outline of the joining surface in a view seen in one direction of the stacking direction of the stacked body 1.

The first conductive foil 25 is thicker than the conductive foils inside stacked body 1. At least a portion of the outline of each conductor-via first joint portion 17 overlaps with the first conductive foil 25 in a view seen in one direction of the stacking direction of the stacked body 1. The outline of each conductor-via second joint portion 18 does not overlap with the first conductive foil 25 in a view seen in one direction of the stacking direction of the stacked body 1.

The resin portion 15 is adjacent to the outside of each conductor-via first joint portion 17 along a portion of the outline of each conductor-via first joint portion 17, the portion overlapping with the first conductive foil 25. The resin portion 15 is preferably made of a resin paste including thermoplastic resin powder, for example, liquid crystal polymer powder, as a main material. The liquid component of the resin paste does not substantially remain in the resin portion 15. The resin portion is not disposed in the portion along the outline of each conductor-via second joint portion 18.

In the portion overlapping with the first conductive foil 25, the first conductive foil 25 is relatively thick, so that this portion has increased rigidity. Thus, deformation along the shape of the stacked body is less likely to occur in the thermocompression bonding step. This may lead to an insufficient action of heat or pressure in the thermocompression bonding step. This may result in a non-joined portion in the vicinity of the conductor-via first joint portion. In the present preferred embodiment, however, the resin portion 15 is disposed in such a non-joined portion, so that the resin portion fills the gap in the vicinity of the outline of the joint portion between the conductor vias. Therefore, it becomes possible to reduce or prevent the non-joined state between the resin layers in the portion that tends to be subjected to an insufficient action of heat or pressure by pressing in the thermocompression bonding step.

Figure 23:
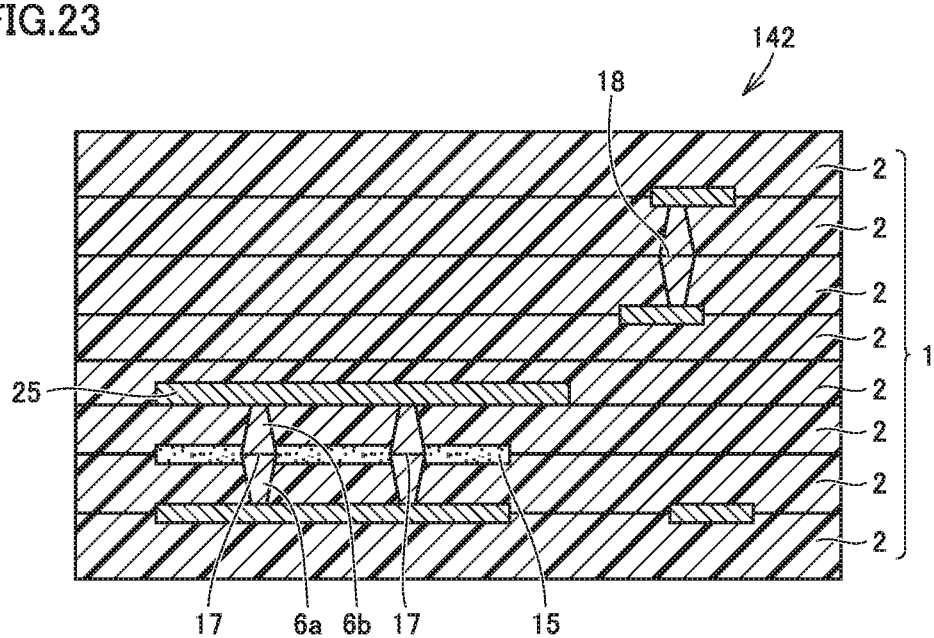
FIG. 23 is a cross-sectional view of a modification of the resin multilayer substrate in the eighth preferred embodiment of the present invention.

As a modification of the resin multilayer substrate in the present preferred embodiment, a resin multilayer substrate as shown in FIG. 23 is also conceivable. FIG. 23 shows a resin multilayer substrate 142. In the resin multilayer substrate 142, the resin portion 15 connects a plurality of conductor-via first joint portions 17 disposed in one layer. This configuration may also be applicable.

It is preferable that the thermoplastic resin as a main material of the resin layer 2 is a liquid crystal polymer and the thermoplastic resin of the resin portion 15 is a liquid crystal polymer. With this configuration, the adhesiveness between the resin layer 2 and the resin portion 15 during thermocompression bonding is increased. It is preferable that the liquid crystal polymer as a main material of the resin layer 2 and the liquid crystal polymer of the resin portion 15 are made of the same or substantially the same liquid crystal polymer material. With this configuration, the resin layer 2 and the resin portion 15 inside stacked body 1 are made of the same or substantially the same liquid crystal polymer material. Thus, it becomes possible to reduce or prevent position-depending variations in characteristics of the insulator portion in the stacked body.

In addition, an appropriate combination of a plurality of preferred embodiments among the above-described preferred embodiments may be used.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A resin multilayer substrate comprising:
   a stacked body including a plurality of resin layers each made of a thermoplastic resin as a main material and stacked on each other;
   a cavity provided in the stacked body so as to be recessed in a stacking direction of the stacked body;
   one or more first conductor patterns each disposed in a gap between the plurality of resin layers inside the stacked body and each including an outline in a view seen in one direction of the stacking direction of the stacked body; and
   one or more second conductor patterns each disposed in a gap between the plurality of resin layers inside the stacked body and each including an outline in the view seen in the one direction of the stacking direction of the stacked body; wherein
   at least a portion of the outline of each of the one or more first conductor patterns overlaps with the cavity in the view seen in the one direction of the stacking direction of the stacked body;
   the outline of each of the one or more second conductor patterns does not overlap with the cavity in the view seen in the one direction of the stacking direction of the stacked body;
   a resin portion is provided adjacent to an outside of each of the one or more first conductor patterns along a portion of the outline of each of the one or more first conductor patterns that overlaps with the cavity;
   the resin portion is made of a resin paste including thermoplastic resin powder as a main material;
   a liquid component of the resin paste is not substantially present in the resin portion; and
   the resin portion is not disposed in a portion along the outline of each of the one or more second conductor patterns.

2. The resin multilayer substrate according to claim 1, wherein
   the thermoplastic resin of each of the plurality of resin layers is a liquid crystal polymer; and
   the thermoplastic resin of the resin portion is a liquid crystal polymer.

3. The resin multilayer substrate according to claim 2, wherein the liquid crystal polymer of each of the plurality of resin layers and the liquid crystal polymer of the resin portion are made of a same or substantially a same liquid crystal polymer material.

\* \* \* \* \*